(12) United States Patent
Phalen

(10) Patent No.: US 6,897,378 B2
(45) Date of Patent: May 24, 2005

(54) TECHNIQUE FOR SURFACE MOUNTING ELECTRICAL COMPONENTS TO A CIRCUIT BOARD

(75) Inventor: Michael Dennis Phalen, Davison, MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/628,823

(22) Filed: Jul. 28, 2003

(65) Prior Publication Data

US 2004/0027810 A1 Feb. 12, 2004

Related U.S. Application Data

(62) Division of application No. 09/844,575, filed on Apr. 30, 2001, now Pat. No. 6,655,018.

(51) Int. Cl.[7] .............................. H02G 3/08; H05K 5/00
(52) U.S. Cl. ....................... 174/52.1; 174/260; 361/773
(58) Field of Search ................................ 174/52.1, 260, 174/262, 263, 264, 265, 266; 361/773

(56) References Cited

U.S. PATENT DOCUMENTS 4,541,034 A * 9/1985 Fanning ...................... 361/773
5,446,623 A * 8/1995 Kanetake ..................... 361/760
5,726,862 A * 3/1998 Huynh et al. ................ 361/773
6,274,823 B1   8/2001 Khandros et al. ........... 174/261
6,336,269 B1   1/2002 Eldridge et al. .............. 29/885

* cited by examiner

Primary Examiner—Hung V. Ngo
(74) Attorney, Agent, or Firm—Stefan V. Chmielewski

(57) ABSTRACT

A technique for mounting an electrical component to a circuit board includes deforming each of a number of electrical terminals extending from the electrical component to form a mounting portion and a tip portion extending away from the mounting portion. The circuit board defines a number of bores extending therein from a first surface to a second opposite surface, and the electrical component is mounted to the circuit board with the mounting portion of each of the number of electrical terminals supporting the component against the first surface of the circuit board with each of the tip portions extending into separate ones of the number of bores. The mounting portion of each of the electrical terminals is mechanically and electrically affixed to corresponding electrically conductive pads to thereby surface mount the electrical component to the circuit board. The disclosed technique is particularly advantageous for surface mounting display units.

6 Claims, 2 Drawing Sheets

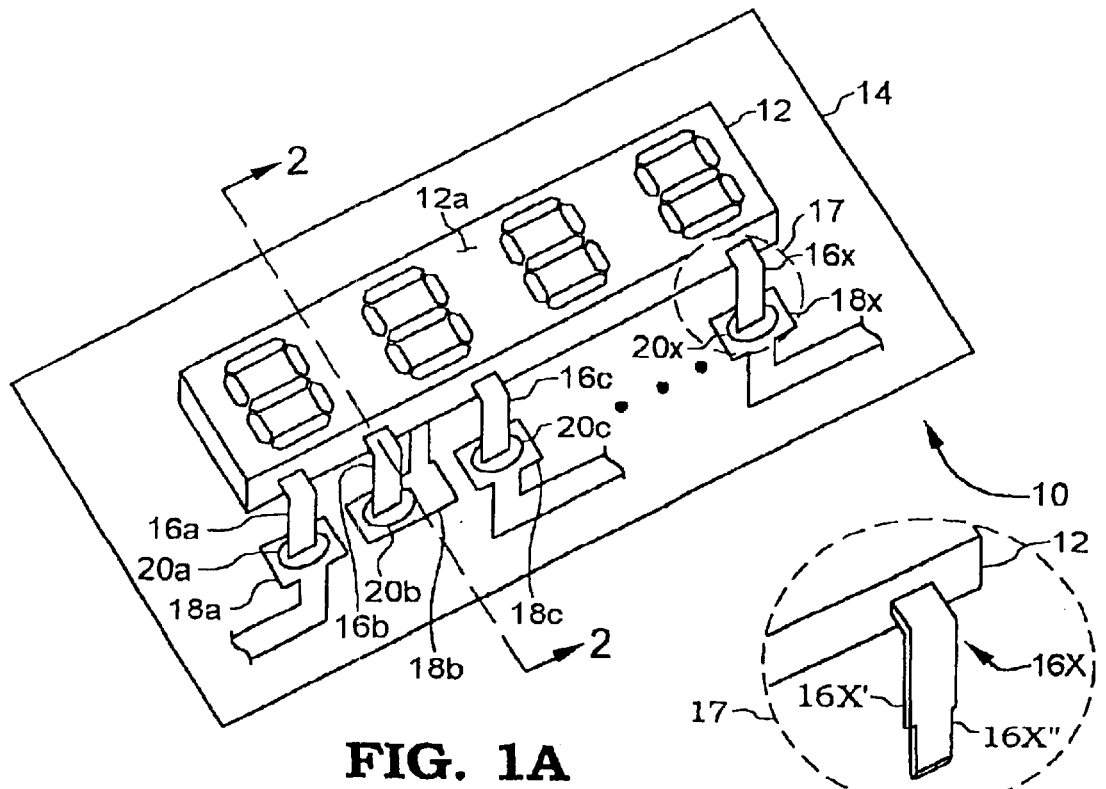
FIG. 1A
(Prior Art)
FIG. 1B
(Prior Art)
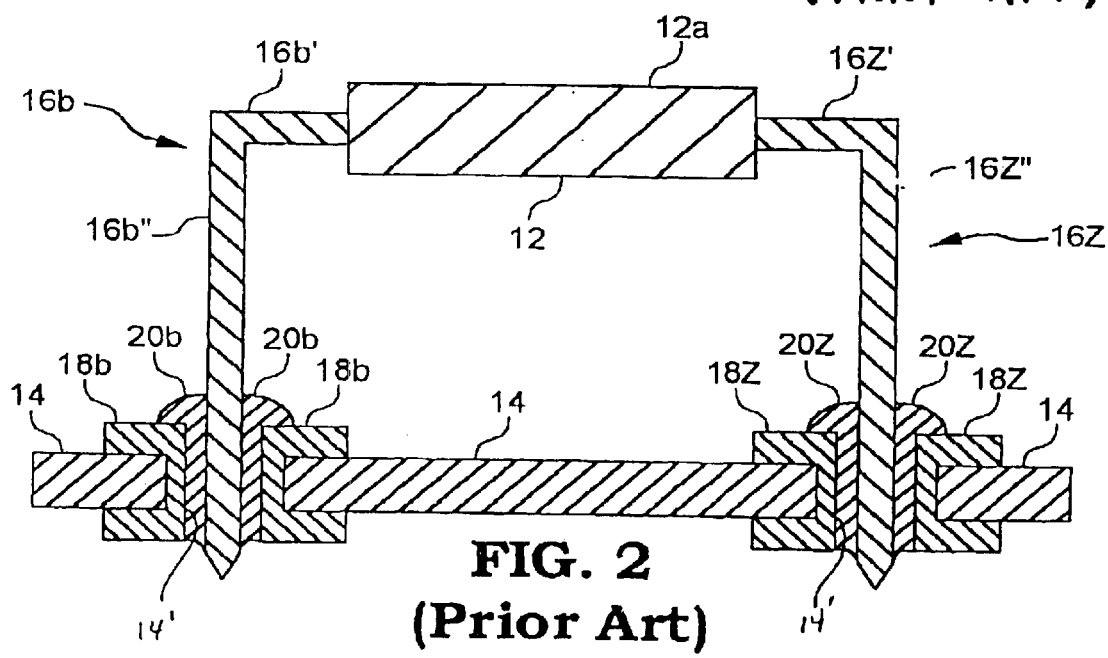
FIG. 2
(Prior Art)

TECHNIQUE FOR SURFACE MOUNTING ELECTRICAL COMPONENTS TO A CIRCUIT BOARD

This is a Division of application Ser. No. 09/844,575, filed Apr. 30, 2001, now U.S. Pat. No. 6,655,018.

TECHNICAL FIELD

The present invention relates generally to techniques for mounting electrical components to circuit boards, and more specifically to techniques for surface mounting electrical components to circuit boards.

BACKGROUND OF THE INVENTION

Techniques for mounting electrical components to circuit boards are known and commonly used in the electronics industry. Many such electrical components include electrical leads (sometimes referred to as "pins" or "terminals") extending therefrom, wherein these electrical leads must be mechanically and electrically attached to the circuit board in forming a desired electrical or electronic circuit.

Early electrical circuit boards included a number of holes or passageways defined therethrough, and an electrically conductive film patterned on a backside thereof. With such circuit boards, electrical components are typically arranged on a top side of the circuit board, and their electrical leads are passed through appropriate holes defined through the board and soldered to the electrically conductive film patterned around the various circuit board holes. In this manner, electrical components are arranged on a top side of the circuit board, and mechanically and electrically attached to an opposite back side of the circuit board to form a desired electrical or electronic circuit.

Advances in circuit board technology have provided for so-called "plated-through" hole technology wherein electrically conductive film can be patterned on both the top side, the back side and/or within a circuit board, as well as on the sidewalls of the various holes defined through the circuit board. Circuit boards implementing plated-through technology provide for the ability to carry out the soldering process on either or both sides of the circuit board.

An example of a known electrical circuit assembly technique utilizing a plated-through hole circuit board is shown in FIGS. 1A and 2. Referring to FIG. 1A, an electrical component 12 is attached to a circuit board 14 via a number of electrical terminals 16a–16x extending from component 12. Circuit board 14 includes a corresponding number of electrically conductive pads 18a–18x defining plated-through holes 14' therethrough (see FIG. 2). Referring to FIG. 1B, each of the electrical terminals 16X conventionally define a region 16X' extending from component 12 and having a first width or cross-sectional area that is larger than the cross-sectional area of the circuit board holes 14', and a region 16X" extending from region 16x' and having a second reduced width or cross sectional area that is smaller than the cross-sectional area of the circuit board holes 14'. The interface between regions 16X' and 16X" typically defines a step that supports the component 12 against the top of the circuit board 14 when the various electrical terminals 16a–16x are extended through the circuit board holes 14'. The electrical terminals 16a–16x are then electrically and mechanically attached to the corresponding electrically conductive pads 18a–18x via solder connections 20a–20x as illustrated in FIG. 1A.

Referring to FIG. 2, a cross-section of the circuit assembly illustrated in FIG. 1A is shown along section lines 2—2.

FIG. 2 illustrates a known technique for electrically and mechanically attaching example electrical leads 16b and 16z (not shown in FIG. 1) of electrical component 12 to circuit board 14. For example, electrical terminal 16b includes a first section 16b' extending from electrical component 12 in a direction generally parallel with a top planar surface 12a thereof. A second section 16b" of electrical terminal 16b extends downwardly and in a direction substantially normal to the planar face 12a of electrical component 12 and through a hole or passageway 14' defined through circuit board 14. The hole or passageway 14' is plated-through as shown by electrically conductive film portions 18b. A solder connection 20b forms an electrical and mechanical attachment of terminal portion 16b" to the electrically conductive film portions 18b.

While the known electrical component mounting techniques described hereinabove and shown with respect to FIGS. 1A, 1B and 2 have been extensively used in the electronics industry, they have certain drawbacks associated therewith. For example, while some electrical components may be mounted flush and in contact with the top of circuit board 14, others must be elevated from the top of the circuit board as shown in FIGS. 1 and 2 for various reasons. In such cases, a number of drawbacks may result. For example, electrical component 12 may be a display unit or other device having a top surface 12a that must not only be elevated from circuit board 14, but must also be substantially parallel with circuit board 14 for proper viewing thereof. If the electrical terminals 16a–16z are not precisely configured such that each of the interfaces between terminal portions 16X' and 16X" define substantially parallel surfaces, special care must then be taken to ensure that electrical component 12 is mounted to circuit board 14 in such a manner that surface 12a is substantially parallel with circuit board 14.

What is therefore needed is a technique for mounting electrical components to circuit boards that overcome the foregoing and other related difficulties associated with conventional electrical component mounting techniques.

SUMMARY OF THE INVENTION

The foregoing shortcomings of the prior art are addressed by the present invention. In accordance with one aspect of the present invention, a method of mounting an electrical circuit component to a circuit board comprises the steps of providing an electrical component having an electrical terminal extending therefrom, providing a circuit board defining a bore extending from a first surface toward a second opposite surface thereof, deforming the electrical terminal to define a mounting portion having a tip portion extending away therefrom, and mounting the electrical component to the circuit board with the mounting portion of the electrical terminal juxtaposed with the first surface of the circuit board and with the tip extending into the bore.

In accordance with another aspect of the present invention, a circuit assembly comprises an electrical component having an electrical terminal extending therefrom, the electrical terminal defining a mounting portion having a tip portion extending therefrom, and a circuit board defining a bore extending from a first surface toward a second opposite surface thereof. The electrical component is mounted to the circuit board with the mounting portion of the electrical terminal juxtaposed with the first surface of the circuit board and with the tip extending into the bore.

One object of the present invention is to provide a technique for surface-mounting an electrical component to a circuit board.

Another object of the present invention is to provide such a technique to simplify the construction of circuit assemblies utilizing display units.

These and other objects of the present invention will become more apparent from the following description of the preferred embodiment.

BRIEF DESCRIPTION OF THE DRAWINGS

The present invention will now be described, by way of example, with reference to the accompanying drawings, in which:

FIG. 1A is a perspective view of a display unit mounted to a circuit board in a known manner;

FIG. 1B is a magnified view of one of the electrical terminals extending from the display unit of FIG. 1A illustrating various conventional details thereof.

FIG. 2 is a cross-sectional view of the circuit assembly shown in FIG. 1 as viewed along section lines 2—2;

DESCRIPTION OF THE PREFERRED EMBODIMENTS

Figure 3:
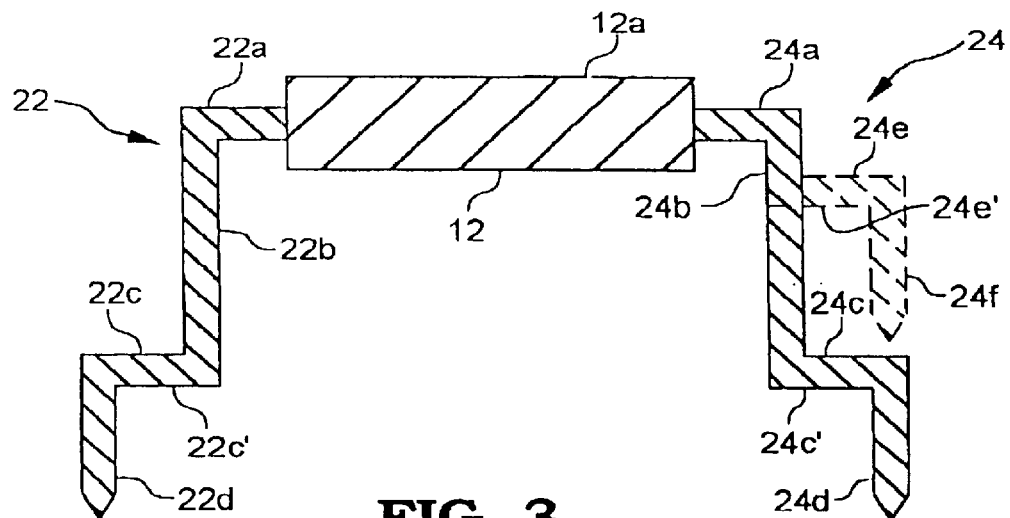
FIG. 3 is a cross-sectional view of an electrical circuit component having a number of electrical terminals processed in accordance with the present invention for surface mounting to a circuit board.

Referring now to FIG. 3, a cross-sectional view of an electrical circuit component 12 is shown having a number of electrical terminals that are structurally modified in accordance with the present invention. As with the electrical component 12 illustrated in FIGS. 1 and 2, component 12 of FIG. 3 may include any number of electrical terminals wherein two such terminals 22 and 24 are illustrated in FIG. 3. Referring specifically to electrical terminal 22, a first section 22a thereof extends from electrical component 12 in a direction generally parallel with top planar surface 12a, and a second section 22b extends downwardly away from section 22a in a substantially perpendicular direction thereto. It is to be understood, however, that section 22b may be configured to extend along any desired direction away from section 22a. In any case, a third section 22c extends away from section 22b preferably in a direction parallel with top surface 12a of component 12 such that a bottom surface 22c' of section 22c is substantially parallel with surface 12a. It is to be understood that section 22c may alternatively be disposed at any desired angle relative to section 22b such that surface 22c' is positioned at any desired angle relative to surface 12a of component 12 or to any other desired reference surface. In any case, electrical terminal 22 includes a fourth section 22d extending away from section 22c preferably in a direction perpendicular thereto. However, it is to be understood that section 22d may alternatively be configured to extend in any desired direction relative to section 22c.

In one preferred embodiment, electrical terminal 24 is configured identically to electrical terminal 22 such that surface 24c' of section 24c is coplanar with surface 22c' of section 22c of electrode 22. In this manner, surfaces 22c' of electrical terminal 22 and 24c' of electrical terminal 24 provide support surfaces for supporting electrical component 12 in the orientation shown in FIG. 3 relative to a flat planar surface such as a circuit board. Alternatively, electrical terminal 24 may be modified such that sections 24c and 24d are replaced by sections 24e and 24f that are identical to sections 24c and 24d with the exception that surface 24e' is not coplanar with surface 22c' of electrode 22. In this embodiment, electrodes 22 and 24 may be mounted to two different surfaces that are not coplanar, but wherein the orientation of surface 12a of electrical component 12 is maintained as shown in FIG. 3.

Figure 4:
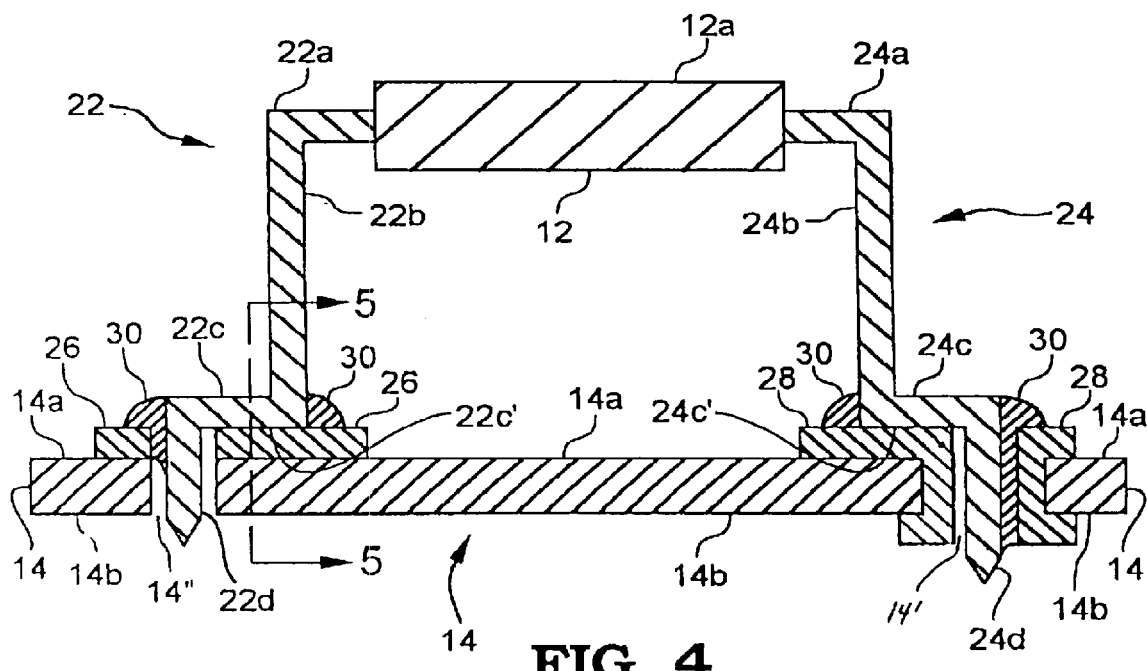
FIG. 4 is a cross-sectional view of the electrical circuit component of FIG. 3 shown mounted to a circuit board in accordance with the present invention.

Referring now to FIG. 4, an electrical circuit assembly is shown having the electrical component 12 of FIG. 3 mounted to a circuit board 14 utilizing the concepts of the present invention. Circuit board 14 includes a top surface 14a and an opposite bottom surface 14b, and defines a number of bores or passageways 14' and 14" from the top surface 14a toward the bottom surface 14b. In one embodiment, bores 14' and 14" extend completely through circuit board 14 from the top surface 14a to the bottom surface 14b, although the present invention contemplates at any one or more of the bores 14' and 14" may alternatively extend from top surface 14a toward bottom surface 14 but not extending completely through circuit board 14. In any case, circuit board 14 preferably includes electrically conductive pads 26 and 28 disposed on the top surface 14a thereof adjacent to bores 14' and 14" as shown in FIG. 4. Electrically conductive pads 26 and 28 are preferably formed from an electrically conductive film (e.g., copper). In one embodiment, the electrically conductive pads are affixed to the top surface 14a of circuit board 14 and patterned to form circuit pads about each of the bores 14" to form non-plated through holes 14" as is known in the art and as shown by example in FIG. 4 with reference to electrically conductive pad 26. Alternatively, the electrically conductive pads are affixed to the top and bottom surfaces 14a and 14b of circuit board 14 as well as through each of the bores 14' to form plated through holes 14' as is known in the art and as shown by example in FIG. 4 with respect to electrically conductive pad 28. Those skilled in the art will recognize that plated through and non-plated through holes are typically not provided on the same circuit board 14 as shown in FIG. 4, and that FIG. 4 is shown with each only to illustrate example embodiments of the present invention.

In accordance with the present invention, electrical component 12 is mounted to circuit board 14 by directing electrical terminal tips or sections 22d and 24d into bores 14' and 14", respectively, from the top surface 14a of circuit board 14. By directing electrical terminal portions 22d and 24d into bores 14' and 14" as just described, electrical terminal surfaces 22c' and 24c' are juxtaposed with, and supported by, electrically conductive pads 26 and 28, respectively. An important advantage gained with the present invention is that by placing tips 22d and 24d of a number of electrical terminals into corresponding circuit board holes and applying pressure to the surface 12a of component 12, circuit board mounting surfaces 22c' and 24c' of electrical terminals 22 and 24 are automatically planarized with respect to the top surface 14a of circuit board 14. This then provides flat surfaces 22c' and 24c' suitable for attachment of electrical component 12 to circuit board 14 via known wave soldering techniques.

Figure 5:
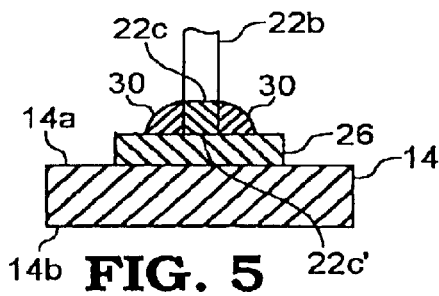
FIG. 5 is a cross-sectional view of the circuit assembly shown in FIG. 4 as viewed along section lines 5—5.

Electrical terminals 22 and 24 are affixed to circuit board 14 after assembly thereof as just described, using any known means for affixing electrical components to circuit boards. In one embodiment, for example, electrical terminals 22 and 24 are electrically and mechanically attached to electrically conductive pads 26 and 28, respectively, via an electrically conductive attachment media such as solder. As shown in FIGS. 4 and 5, for example, section 22c of electrode 22 and/or sections 24c and 24d of electrode 24 is/are electrically and mechanically attached to electrically conductive pads 26 and 28 respectively via solder contact 30. It is to be understood, however, that the present invention contemplates attaching electrical terminals 22 and 24 to circuit board 14 via other known mechanisms therefore. It should also be understood that electrical component 12 may include any number of electrical terminals, such as terminals 22 and 24 shown in FIGS. 3–5, and that any one or more of such terminals may be attached to circuit board 14 as just described.

It should now be apparent from the foregoing description that the present invention provides for effectively surface-mounting an electrical component 12, having a number of electrical terminals extending therefrom, to a circuit board 14. In accordance with the present invention, the electrical terminals are structurally deformed to define a mounting portion (22c, 24c) having a tip portion (22d, 24d) extending away from the mounting portion. The electrical component 12 is mounted to a circuit board 14 with the mounting portions (22c, 24c) juxtaposed in planar relationship with the top surface 14a of circuit board 14 and with the tip portions (22d, 24d) extending into corresponding bores (14', 14") defined by circuit board 14. It is to be understood that electrical component 12 may be any electrical component having one or more electrical terminals extending therefrom, although the concepts of the present invention described herein are particularly advantageous for use with an electrical component 12 in the form of a display unit or device. For example, when electrical component 12 is embodied as a display unit having a viewable top surface 12a, surfaces 22c' and 24c' of electrical terminals 22 and 24, respectively, serve to support the electrical component 12 in the position illustrated in FIGS. 3 and 4, while the tip portions 22d and 24d extending into bores 14' and 14" serve to maintain component 12 on circuit board 14 in place during subsequent component attachment processes such as, for example, wave or reflow soldering processes. The electrical terminal configuration of the present invention therefore provides coplanar surfaces (22c', 24c') to facilitate mounting of an electrical component 12 to a circuit board 14 with a desired orientation and/or offset relative to circuit board 14, while maintaining proper positioning of electrical component 12 relative to circuit board 14 during one or more subsequent electrical component attachment processes.

While the invention has been illustrated and described in detail in the foregoing drawings and description, the same is to be considered as illustrative and not restrictive in character, it being understood that only the preferred embodiments have been shown and described and that all changes and modifications that come within the spirit of the invention are desired to be protected.

What is claimed is:

1. A circuit assembly comprising:

an electrical component having a first electrical terminal extending from one side and a second electrical terminal extending from an opposite side, each said electrical terminal comprising a downward portion adjacent the component, a mounting portion extending from the downward portion outward relative to the component, and a tip portion extending downward from the mounting portion spaced apart from the downward portion; and a circuit board defining a first bore and a second bore extending from a first surface toward a second opposite surface thereof, a first electrically conductive pad about the first bore and a second electrically conductive pad about the second bore, said electrical component mounted to said circuit board such that the tip portion of the first electrical terminal is received in the first bore and the mounting portion of the first electrical terminal is bonded to the first electrically conductive pad, and the tip portion of the second electrical terminal is received in the second bore and the mounting portion of the second electrical terminal is bonded to the second electrically conductive pad, wherein the first and second bores and the first and second conductive pads are disposed outboard relative to the component.

2. The circuit assembly of claim 1 wherein each said mounting portion of said electrical terminal is soldered to said electrically conductive pad.

3. The circuit assembly of claim 1 wherein each said bore extends completely through said circuit board from said first surface to said second opposite surface.

4. The circuit assembly of claim 1 wherein said electrical component defines a viewing surface;

and wherein said mounting portion of each said electrical terminal is disposed substantially parallel with said viewing surface of said electrical component.

5. The circuit assembly of claim 4 wherein said tip portion of each said electrical terminal is disposed substantially perpendicularly away from said mounting portion.

6. The circuit assembly of claim 1 wherein said electrical component is a display unit.

* * * * *